United States Patent
Pav et al.

(10) Patent No.: US 7,119,276 B2
(45) Date of Patent: Oct. 10, 2006

(54) METHOD AND APPARATUS FOR BOARD MOUNTING IN A CHASSIS

(75) Inventors: Darren Pav, Round Rock, TX (US); Richard Eddings, Cedar Park, TX (US); Andrea Falkin, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/887,643

(22) Filed: Jul. 9, 2004

(65) Prior Publication Data

US 2006/0005992 A1    Jan. 12, 2006

(51) Int. Cl.
*H02G 3/08*    (2006.01)
*H05K 5/00*    (2006.01)

(52) U.S. Cl. .................. 174/52.1; 174/138 G; 361/752; 361/758

(58) Field of Classification Search .............. 174/52.1, 174/138 G; 361/752, 756, 758
See application file for complete search history.

(56) References Cited

U.S. PATENT DOCUMENTS

| | | | |
|---|---|---|---|
| 5,260,854 A | | 11/1993 | Hileman et al. |
| 5,750,936 A | * | 5/1998 | Wheatley et al. ........ 174/138 G |
| 6,377,445 B1 | * | 4/2002 | Davis et al. ................ 361/683 |
| 6,424,538 B1 | * | 7/2002 | Paquin ........................ 361/752 |
| 6,456,506 B1 | * | 9/2002 | Lin ............................. 361/816 |
| 6,490,168 B1 | * | 12/2002 | Rochowicz et al. ........ 361/784 |
| 6,493,233 B1 | * | 12/2002 | De Lorenzo et al. ....... 361/752 |
| 6,535,394 B1 | | 3/2003 | Hirzmann |
| 6,560,119 B1 | * | 5/2003 | Katsuyama et al. ........ 361/752 |
| 6,751,102 B1 | * | 6/2004 | Chen .......................... 361/758 |
| 6,813,161 B1 | * | 11/2004 | Le et al. ..................... 361/758 |

* cited by examiner

*Primary Examiner*—Hung V. Ngo
(74) *Attorney, Agent, or Firm*—Haynes and Boone, LLP (57) ABSTRACT

A board mounting apparatus includes a chassis and a chassis base member positioned in the chassis, the chassis base member defining a channel and an open volume adjacent the channel. A first portion of the channel comprises a first width. A second portion of the channel has a second width greater than the first width. The second portion is operable to accept a sliding connector, and the first portion is operable to secure at least a portion of both a fixed and sliding connector.

24 Claims, 8 Drawing Sheets

METHOD AND APPARATUS FOR BOARD MOUNTING IN A CHASSIS

BACKGROUND

The present disclosure relates generally to information handling systems, and more particularly to method and apparatus for mounting a board in an information handling system chassis.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically include a board, such as a motherboard, which includes the information handling systems basic circuitry and components. The board can be secured to a chassis, and system components may then be attached and removed from the board as needed.

The assembly of the board to the chassis can raise a number of problems. In some situations, it is more cost efficient to secure the board to the chassis with fixed connectors, such as threaded fasteners. In other situations, cost efficiency is maximized by including a slidable connector on the board to secure the board to the chassis. During the life of a typical information handling system design, the assembly method used for the board may need to be switched to react to changes in board design, price fluctuations, quality considerations, and many other factors that effect cost advantage.

Accordingly, it would be desirable to provide for mounting a board in an information handling system chassis absent the disadvantages found in the prior methods discussed above.

SUMMARY

According to one embodiment, a board mounting apparatus is included that provides a chassis and a chassis base member positioned in the chassis, the chassis base member defining a channel and an open volume adjacent the channel. A first portion of the channel comprises a first width. A second portion of the channel has a second width greater than the first width.

A principal advantage of this embodiment is that it provides a board and chassis assembly solution that maximizes flexibility and decreases cost.

BRIEF DESCRIPTION OF THE DRAWINGS

FIG. 2b is a top view illustrating an embodiment of the board mounting apparatus of FIG. 2a.

FIG. 2c is a cross sectional view illustrating an embodiment of the board mounting apparatus of FIG. 2a taken along line 2c of FIG. 2a.

FIG. 4a is a perspective view illustrating an embodiment of the board of FIG. 3 being secured to a chassis with the board mounting apparatus of FIG. 2a.

FIG. 4b is a perspective view illustrating an embodiment of the board of FIG. 3 secured to a chassis with the board mounting apparatus of FIG. 2a.

FIG. 5b is a cross sectional view illustrating an embodiment of the board of FIG. 5a taken along line 5b of FIG. 5a.

FIG. 6a is a perspective view illustrating the board of FIG. 5a being secured to a chassis with the board mounting apparatus of FIG. 2a.

FIG. 6b is a perspective view illustrating the board of FIG. 5a being secured to a chassis with the board mounting apparatus of FIG. 2a.

FIG. 6c is a perspective view illustrating the board of FIG. 5a secured to a chassis with the board mounting apparatus of FIG. 2a.

FIG. 7b is a cross sectional view illustrating an embodiment of the board mounting apparatus of FIG. 7a.

FIG. 7c is a top view illustrating an embodiment of the board mounting apparatus of FIG. 7a.

FIG. 8 is a cross sectional view illustrating the board of FIG. 3 secured to a chassis with the board mounting apparatus of FIG. 7a.

FIG. 9 is a cross sectional view illustrating the board of FIG. 5a secured to a chassis with the board mounting apparatus of FIG. 7a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
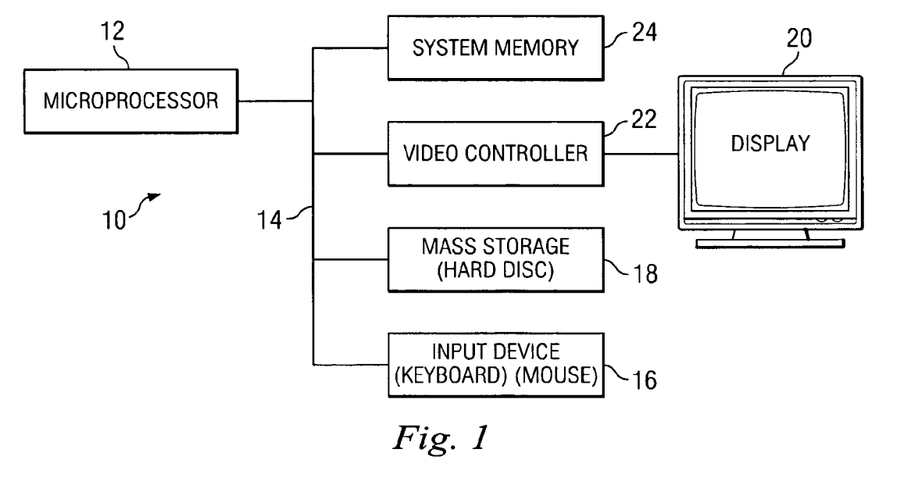
FIG. 1 is a schematic view illustrating an embodiment of an information handling system.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2A:
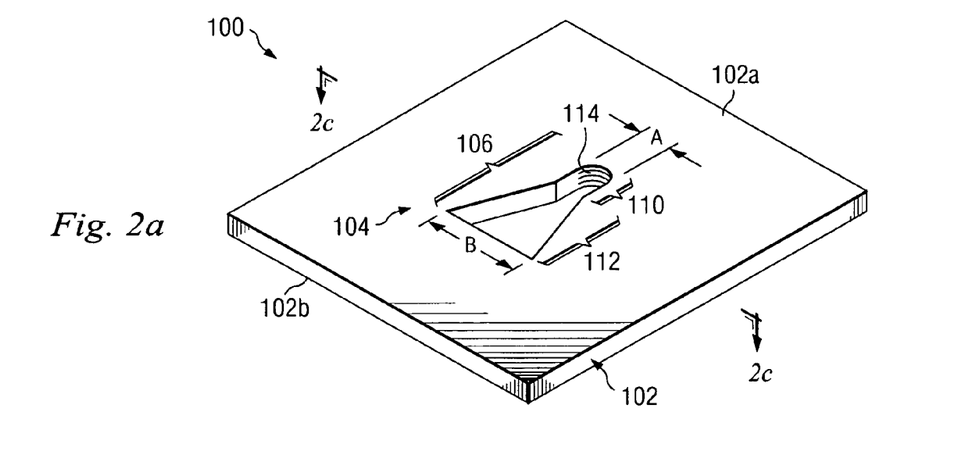
FIG. 2a is a perspective view illustrating an embodiment of a board mounting apparatus.
Figure 2B:
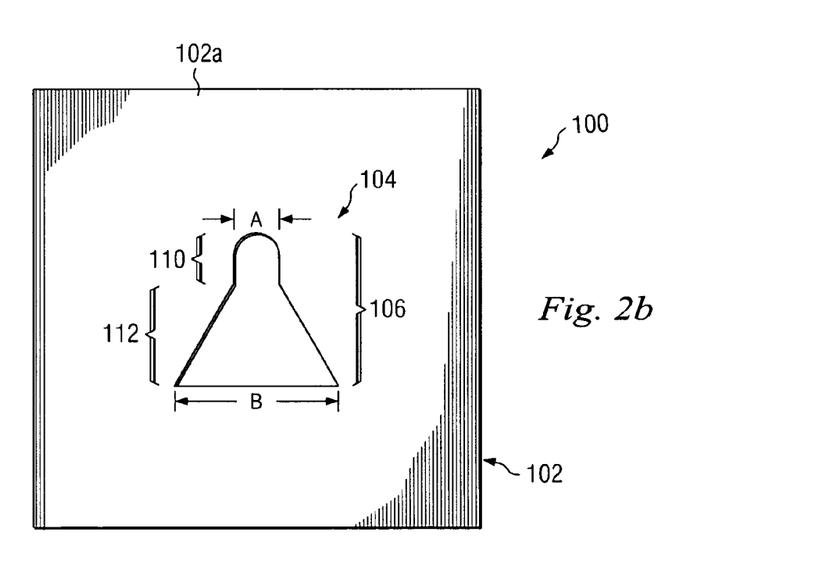
Figure 2C:
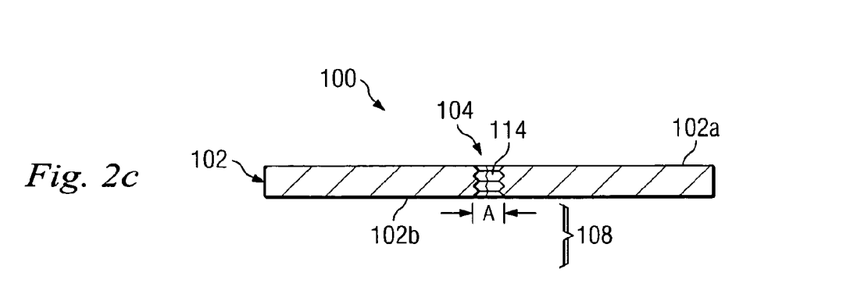

Referring to FIGS. 2a, 2b, and 2c, a board mounting apparatus 100 includes a chassis 102 with a chassis upper surface 102a and a chassis lower surface 102b. A chassis base member 104 is positioned on the chassis 102, the chassis base member 104 defining a channel 106 and an open volume 108 adjacent the channel 106 and the chassis bottom surface 102b. The channel 106 includes a first portion 110 having approximately a width A. A second portion 112 of the channel 106 is situated adjacent the first portion 110 and increases from the width A immediately adjacent the first portion 110 to approximately a width B at the end of the second portion 112 opposite the first portion 110. In an exemplary embodiment, first portion 110 of channel 106 includes internal threads 114.

Figure 3:
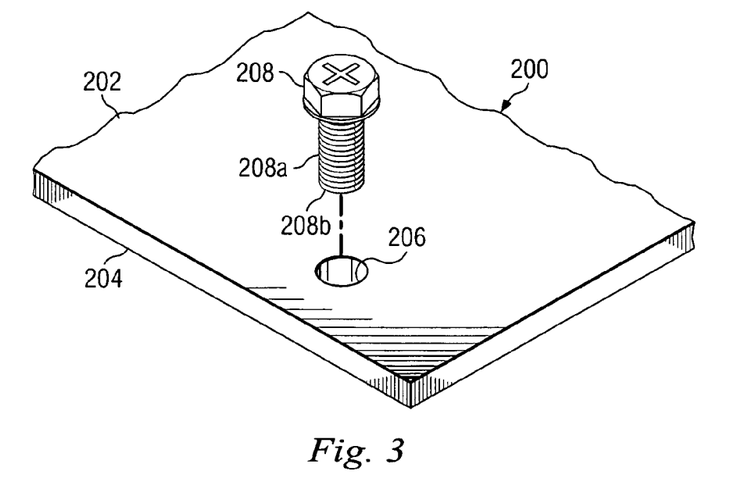
FIG. 3 is a perspective view illustrating an embodiment of a board with a fixed connector.

Referring now to FIG. 3, a board 200 includes an upper surface 202 and a lower surface 204 opposite the upper surface 202. The board 200 defines a hole 206 extending between the upper surface 202 and the lower surface 204. A fixed connector 208 is provided and, in one embodiment, includes external threads 208a and end 208b. The fixed connector 208 may be a threaded fastener, as shown in FIG. 3, a push rivet, a nut and bolt, or a variety of other equivalent connecting devices.

Figure 4A:
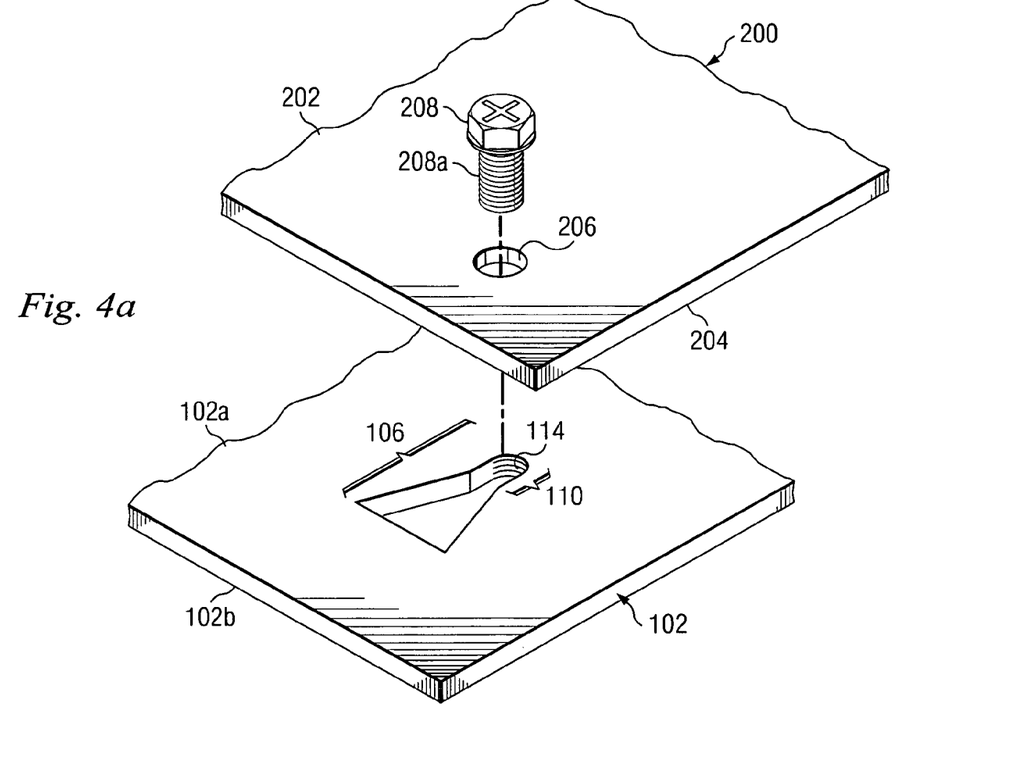
Figure 4B:
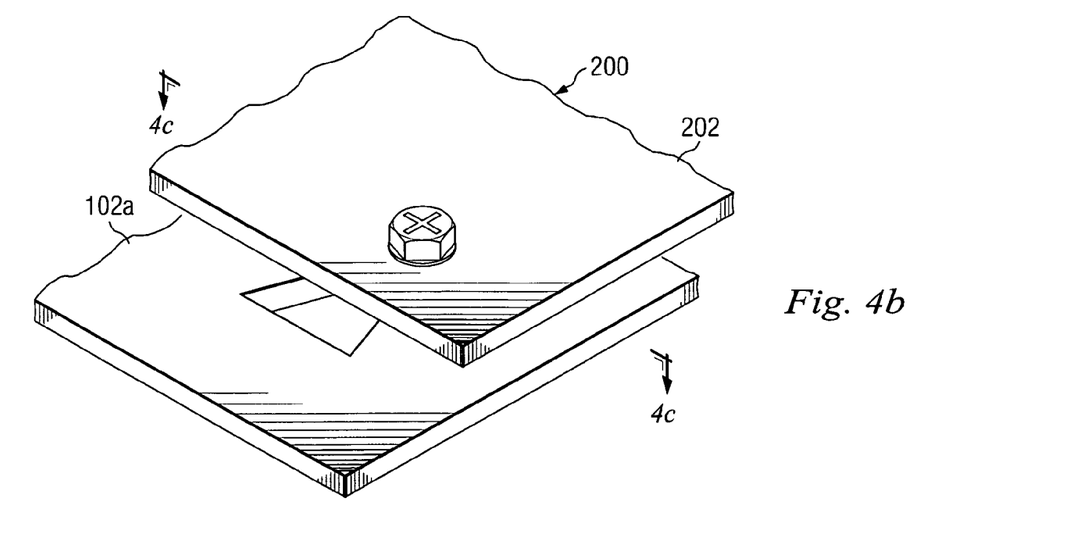
Figure 4C:
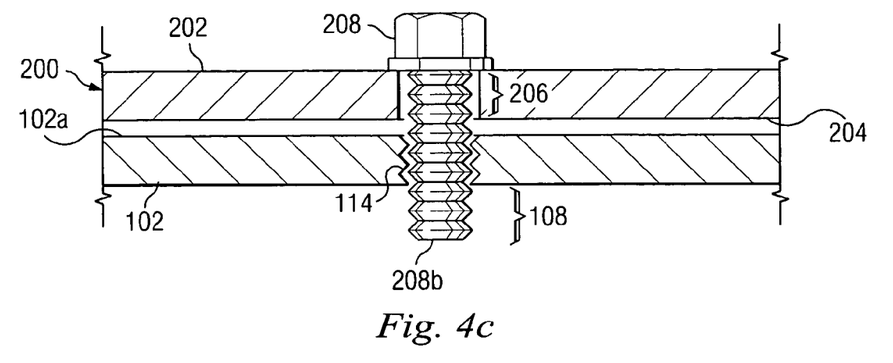
FIG. 4c is a partial cross sectional view illustrating an embodiment of the board of FIG. 3 secured to a chassis with the board mounting apparatus of FIG. 2a taken along line 4c of FIG. 4b.

In operation, as illustrated in FIGS. 4a, 4b, and 4c, the board 200 is situated above and substantially parallel the chassis 102 such that lower surface 204 on board 200 is facing upper surface 102a on chassis 102. Hole 206 defined by board 200 is positioned such that the hole 206 is directly above first portion 110 on channel 106. Board 200 is then brought towards chassis 102 until lower surface 204 on board 200 engages upper surface 102a on chassis. Fixed connector 208 is placed in hole 206 defined by board 200 and the fixed connector 208 may then secure the board 200 to chassis 102 by situating it in first portion 110 of channel 106. In an exemplary embodiment, the fixed connector 208 includes external threads 208a corresponding to internal threads 114 in first portion 110 of channel 106, and the board 200 is secured to the chassis 102 by threading the fixed connector 208 to the first portion 100 of channel 106. When the board 200 is secured to the chassis 102, end 208b of fixed connector 208 may extend into the open volume 108 defined by chassis 102.

Figure 5A:
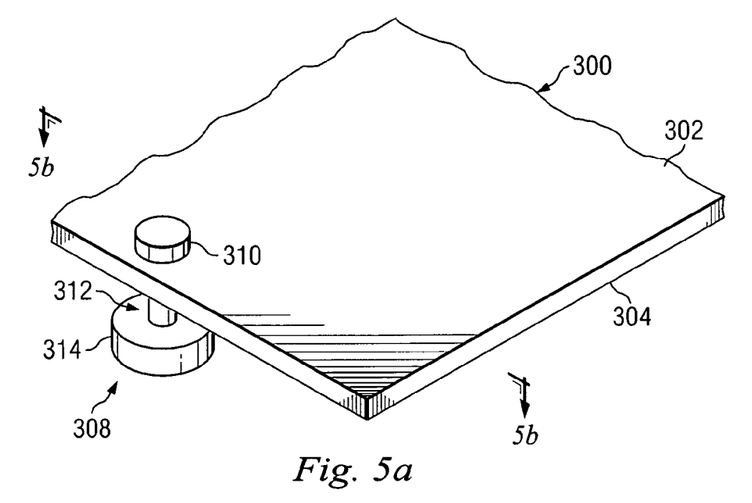
FIG. 5a is a perspective view illustrating an embodiment of a board with a slidable connector.
Figure 5B:
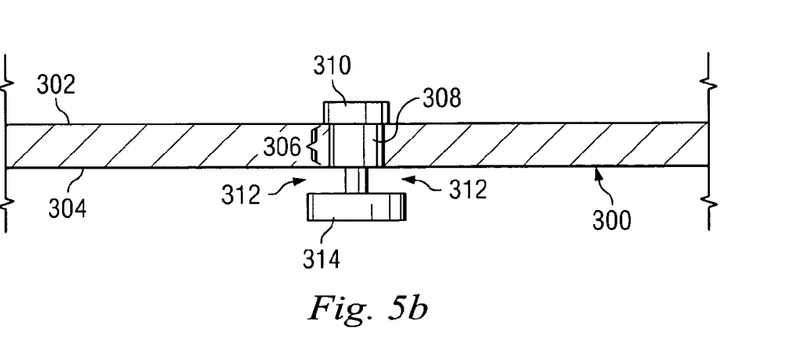

In an alternative embodiment, as illustrated in FIGS. 5a and 5b, a board 300 includes an upper surface 302 and a lower surface 304 opposite the upper surface 302. The board 300 defines a hole 306 extending between the upper surface 302 and the lower surface 304. A slidable connector 308 is situated in the hole 306 and coupled to board 300. The slidable connector 308 includes an upper flange 310 which engages upper surface 302 on board 300, a annular channel 312 defined by the slidable connector 308 and situated adjacent the lower surface 304 of board 300, and a lower flange 314 adjacent the annular channel 312.

Figure 6A:
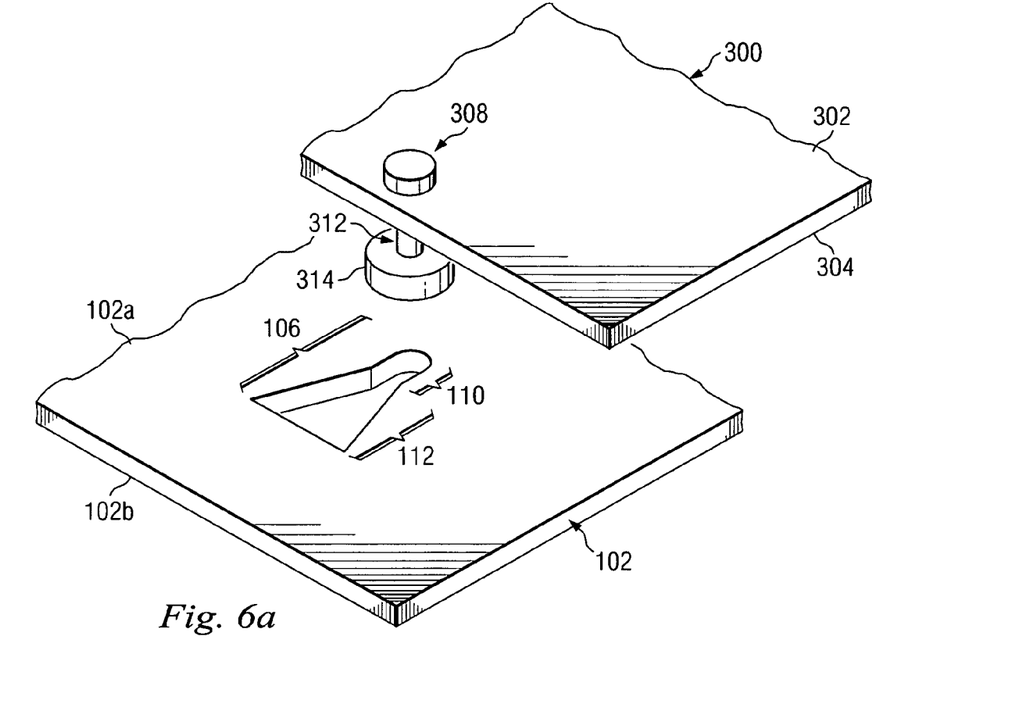
Figure 6B:
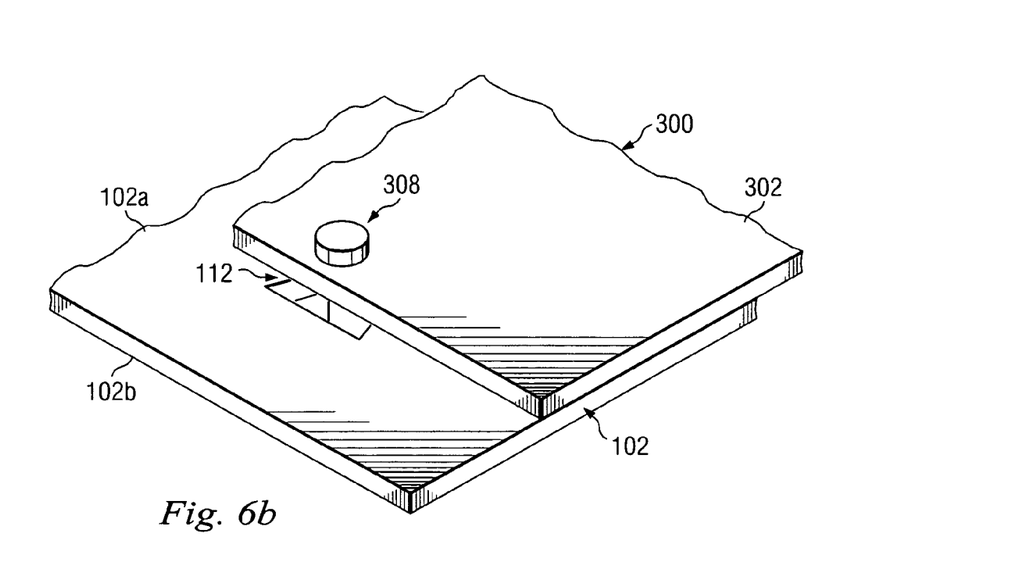
Figure 6C:
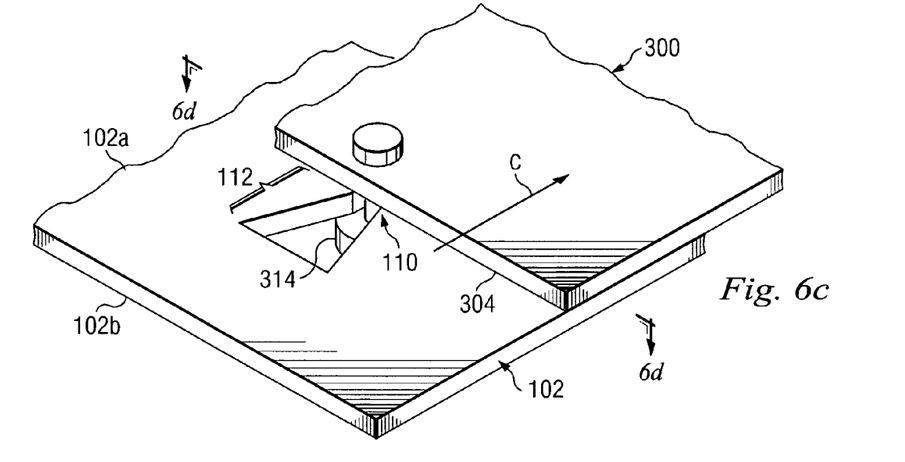
Figure 6D:
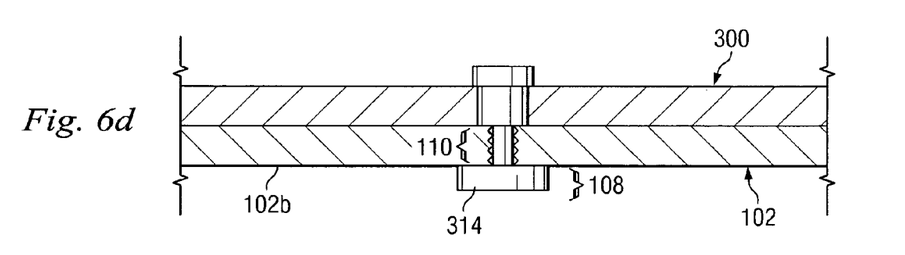
FIG. 6d is a cross sectional view illustrating the board of FIG. 5a secured to a chassis with the board mounting apparatus of FIG. 2a taken along line 6d of FIG. 6c.

In operation, as illustrated in FIGS. 6a, 6b, 6c, and 6d, the board 300 is situated above and substantially parallel the chassis 102 such that lower surface 304 on board 300 is facing upper surface 102a on chassis 102. Slidable connector 308 coupled to board 300 is positioned such that the lower flange 314 on slidable connector 308 is positioned directly above second portion 112 on channel 106. Board 300 is then brought towards chassis 102 until lower surface 304 on board 300 engages upper surface 102a on chassis 102 and annular channel 312 on slidable connector 308 is located in second portion 112 of channel 106 and lower flange 314 is located in open volume 108 defined by chassis 102, as illustrated in FIG. 6b. Board 300 may then be moved in a direction C, as illustrated in FIG. 6c, such that annular channel 312 is situated in first portion 110 and lower flange 314 engages lower surface 102b on chassis 102 while being situated in open volume 108 defined by chassis 102. In an exemplary embodiment, when board 300 contacts the end of first portion 110 on channel 106 and can no longer move in a direction C, the board is secured to the chassis 102.

Figure 7A:
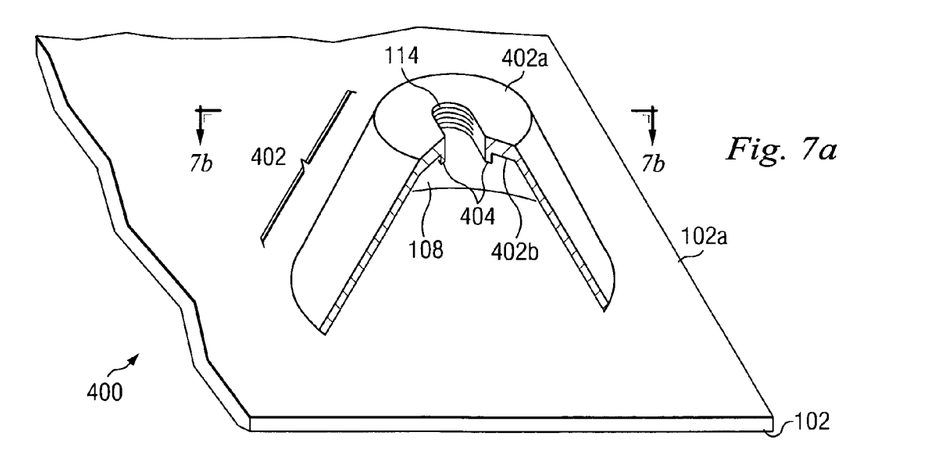
FIG. 7a is a perspective view illustrating an embodiment of a board mounting apparatus.
Figure 7B:
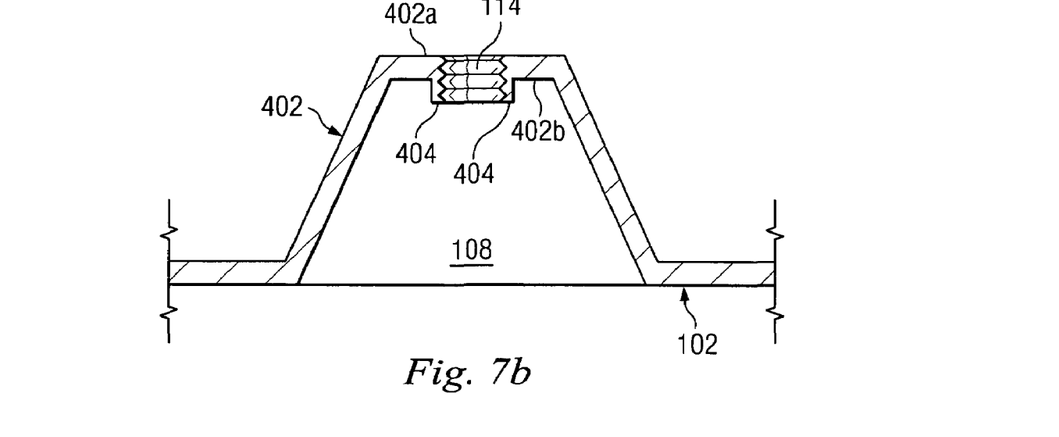
Figure 7C:
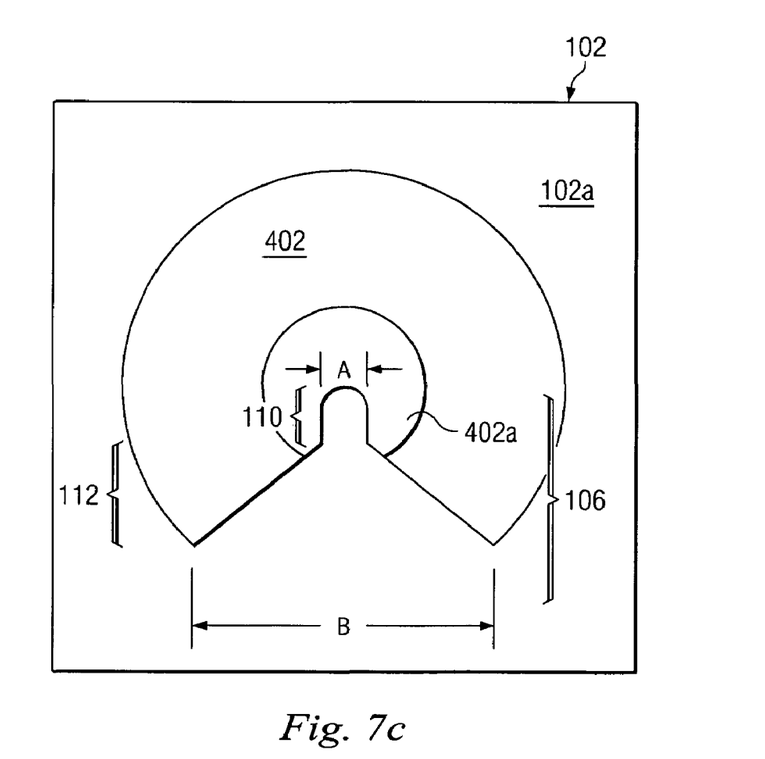
Figure 8:
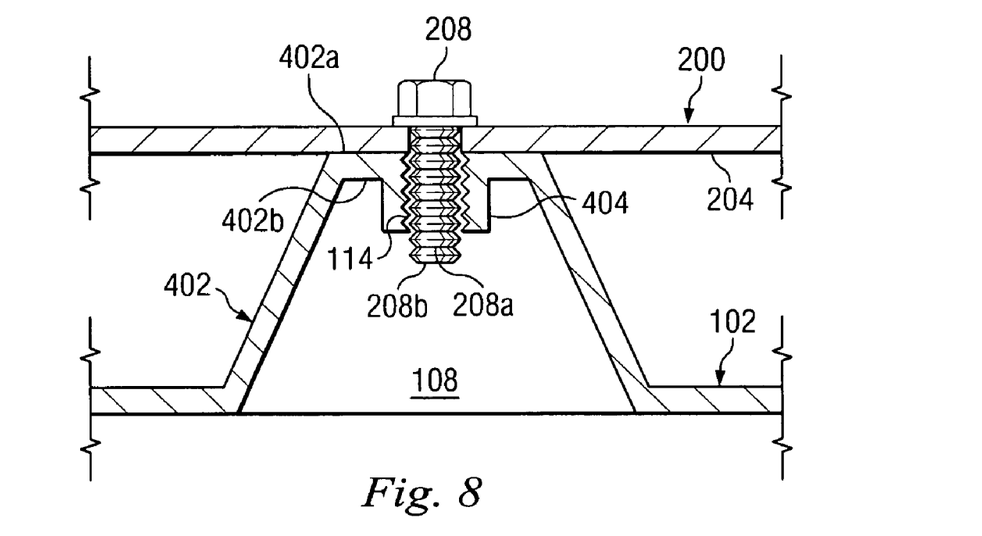
Figure 9:
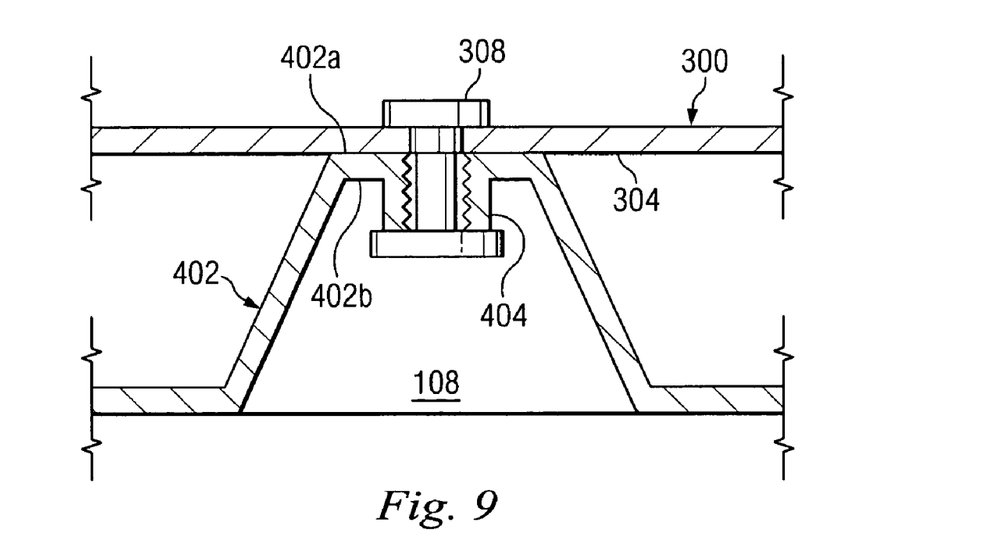

Referring now to FIGS. 7a, 7b, and 7c, an alternative embodiment of a board mounting apparatus 400 is substantially identical in design and operation to board mounting apparatus 100 described above with reference to FIGS. 1, 2a, 2b, 2c, 3, 4a, 4b, 4c, 5a, 5b, 6a, 6b, 6c, and 6d with the addition of an embossed chassis base member 402 positioned on the chassis 102 replacing the chassis base member 104.

Embossed chassis base member 402 is positioned on chassis 102 and raised from chassis upper surface 102a such that embossed chassis base member 402 has a substantially trapezoidal cross section, as illustrated in FIG. 7b. Embossed chassis base member 402 has a base member upper surface 402a and defines channel 106 and open volume 108 adjacent the channel 106. The channel 106 includes first portion 110 having approximately a width A. Second portion 112 of the channel 106 is situated adjacent the first portion 110 and increases from width A immediately adjacent the first portion 110 to width B at the end of second portion 112 opposite the first portion 110 and adjacent upper surface 102a on chassis 102. In an exemplary embodiment, first portion 110 of channel 106 includes internal threads 114. In an exemplary embodiment, a base member bottom surface 402b may include a lip 404 extending from the base member bottom surface 402b around the periphery of the first portion 110.

In an exemplary embodiment, during operation, as illustrated in FIGS. 3, 7a, 7b, 7c, and 8, the board 200 is situated above and substantially parallel the chassis 102 such that lower surface 204 on board 200 is facing base member upper surface 402a on embossed chassis base member 402. Hole 206 defined by board 200 is positioned such that the hole 206 is directly above first portion 110 on channel 106. Board 200 is then brought towards chassis 102 until lower surface 204 on board 200 secure the board 200 to chassis 102 by situating it in first portion 110 of channel 106. In an exemplary embodiment, the fixed connector 208 includes external threads 208a corresponding to internal threads 114 in first portion 110 of channel 106, and the board 200 is secured to the chassis 102 by threading the fixed connector 208 to the first portion 100 of channel 106. When the board 200 is secured to the chassis 102, end 208b of fixed connector 208 may extend into the open volume 108 defined by embossed chassis base member 402.

In an exemplary embodiment, during operation, as illustrated in FIGS. 5a, 5b, 7a, 7b, 7c, and 9, the board 300 is situated above and substantially parallel the chassis 102 such that lower surface 304 on board 300 is facing base member upper surface 402a on embossed chassis base member 402. Slidable connector 308 coupled to board 300 is positioned such that the lower flange 314 on slidable connector 308 is positioned directly above second portion 112 on channel 106. Board 300 is then brought towards chassis 102 until lower surface 204 on board 200 engages base member upper surface 402a on chassis 102 and annular channel 312 on slidable connector 308 is located in second portion 112 of channel 106 and lower flange 314 is located in open volume 108 defined by embossed chassis base member 402. Board 300 may then be moved towards first portion 110 such that annular channel 312 is situated in first portion 110 and lower flange 314 engages base member lower surface 402b on embossed chassis base member 402 while being situated in open volume 108 defined by embossed chassis base member 402. In an exemplary embodiment, when board 300 contacts the end of first portion 110 on channel 106, the board 300 is secured to the chassis 102.

It is understood that variation may be made in the foregoing without departing from the scope of the disclosed embodiments. Furthermore, the elements and teachings of the various illustrative embodiments may be combined in whole or in part some or all of the illustrative embodiments.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A board mounting apparatus comprising:
    a chassis;
    a chassis base member positioned in the chassis, the chassis base member embossed from the chassis and defining a channel and an open volume adjacent the channel;
    a first portion of the channel comprising a first width and being of a construction sufficient to secure one of a threaded connector and a non-threaded flanged connector; and
    a second portion of the channel having a second width greater than the first width.

2. The apparatus of claim 1 wherein a thread groove is defined by the chassis base member and located immediately adjacent the first portion of the channel.

3. The apparatus of claim 1 wherein the chassis base member has a substantially trapezoidal cross section.

4. The apparatus of claim 1 wherein the first portion is operable to secure at least a portion of a fixed connector.

5. The apparatus of claim 4 wherein the fixed connector is a threaded fastener.

6. The apparatus of claim 1 wherein the second portion is operable to accept a slidable connector, whereby once the slidable connector is accepted by the second portion, the slidable connector may be secured in the first portion.

7. The apparatus of claim 1 further comprising:
    a board mounted to the chassis through the chassis base member.

8. A board mounting apparatus comprising:
    a chassis including a chassis surface;
    at least one chassis base member positioned in the chassis, the at least one chassis base member embossed from the chassis and defining a channel and an open volume adjacent the channel;
    a first portion of the channel comprising a first width and being of a construction sufficient to secure one of a threaded connector and a non-threaded flanged connector; and
    a second portion of the channel increasing from the first width to a second width, the second width greater than the first width, the second portion operable to accept a sliding connector.

9. The apparatus of claim 8 wherein the at least one chassis base member has a substantially trapezoidal cross section.

10. The apparatus of claim 8 wherein a thread groove is defined by the chassis base member and located immediately adjacent the first portion of the channel.

11. The apparatus of claim 8 wherein the fixed connector is a threaded fastener.

12. The apparatus of claim 8 wherein once the sliding connector is accepted by the second portion, the sliding connector may be secured in the first portion.

13. The apparatus of claim 12 wherein the second portion extends between the first portion and the chassis surface.

14. The apparatus of claim 8 further comprising:
    a board mounted to the chassis through the at least one chassis base member.

15. An information handling system comprising:
    a chassis;
    a board including a microprocessor, the board operable to be mounted to the chassis;
    a chassis base member positioned in the chassis, the chassis base member embossed from the chassis and defining a channel and an open volume adjacent the channel;
    a first portion of the channel comprising a first width, the first portion operable to secure the board to the chassis and being of a construction sufficient to secure one of a threaded connector and a non-threaded flanged connector; and
    a second portion of the channel having a second width greater than the first width.

16. The system of claim 15 wherein a thread groove is defined by the chassis base member and located immediately adjacent the first portion of the channel.

17. The system of claim 15 wherein the chassis base member has a substantially trapezoidal cross section.

18. The system of claim 15 wherein the first portion is operable to secure at least a portion of a fixed connector.

19. The system of claim 18 wherein the fixed connector is a threaded fastener.

20. The system of claim 15 wherein the second portion is operable to accept a slidable connector, whereby once the slidable connector is accepted by the second portion, the slidable connector may be secured in the first portion.

21. The system of claim 15 wherein the board is mounted to the chassis through the chassis base member.

22. A method for mounting a board in a chassis comprising:
- providing a chassis;
- embossing a chassis base member from the chassis, the chassis base member defining a channel and an open volume adjacent the channel;
- providing a first portion of the channel comprising a first width and comprising a thread groove defined by the chassis base member and located immediately adjacent the first portion of the channel; and
- providing a second portion of the channel increasing from the first width to a second width, the second width greater than the first width.

23. The method of claim 22 further comprising:
securing a board to the chassis through the chassis base member, wherein the securing comprises providing a fixed connector and a hole defined by the board, and situating the fixed connector in the hole defined by the board and in the first portion on the chassis base member.

24. The method of claim 22 further comprising:
securing a board to the chassis through the chassis base member, wherein the securing comprises coupling a slidable connector to the board, the slidable connector including a securing end, locating the slidable connector in the second portion with the securing end in the open volume, and situating the slidable connector in the first portion with the securing end situated in the open volume.

* * * * *